(12) United States Patent
Quiambao et al.

(10) Patent No.: US 11,016,149 B2
(45) Date of Patent: May 25, 2021

(54) DETECTING INTERNAL SHORT CIRCUITS IN BATTERIES

(71) Applicant: THE BOEING COMPANY, Chicago, IL (US)

(72) Inventors: Jimmy M. Quiambao, Walnut, CA (US); James L. Peck, Huntington Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 119 days.

(21) Appl. No.: 16/450,404

(22) Filed: Jun. 24, 2019

(65) Prior Publication Data

US 2019/0317156 A1   Oct. 17, 2019

Related U.S. Application Data

(63) Continuation of application No. 15/246,194, filed on Aug. 24, 2016, now Pat. No. 10,330,739.

(51) Int. Cl.
| | |
|---|---|
| *H02J 7/00* | (2006.01) |
| *G01R 31/396* | (2019.01) |
| *G01R 31/392* | (2019.01) |
| *G01R 31/389* | (2019.01) |
| *G01R 31/50* | (2020.01) |

(52) U.S. Cl.
CPC ......... *G01R 31/396* (2019.01); *G01R 31/389* (2019.01); *G01R 31/392* (2019.01); *H02J 7/0018* (2013.01); *H02J 7/0026* (2013.01); *G01R 31/50* (2020.01)

(58) Field of Classification Search
None
See application file for complete search history.

(56) References Cited

U.S. PATENT DOCUMENTS

| | | | |
|---|---|---|---|
| 6,424,157 B1 | 7/2002 | Gollomp et al. | |
| 10,330,739 B2 | 6/2019 | Quiambao et al. | |
| 2005/0110460 A1* | 5/2005 | Arai ................. | H01M 10/6563 320/116 |
| 2010/0253278 A1* | 10/2010 | Chang ................. | H02J 7/0026 320/101 |
| 2012/0169296 A1 | 7/2012 | Lukso et al. | |
| 2013/0015821 A1 | 1/2013 | Kim et al. | |
| 2013/0026989 A1 | 1/2013 | Gibbs et al. | |
| 2014/0042974 A1 | 2/2014 | Yang et al. | |
| 2014/0320088 A1 | 10/2014 | Nysen | |
| 2014/0354213 A1 | 12/2014 | Rivera-Poventud et al. | |
| 2015/0323610 A1 | 11/2015 | Ahn et al. | |

* cited by examiner

*Primary Examiner* — Robert Grant
(74) *Attorney, Agent, or Firm* — Patterson + Sheridan, LLP

(57) ABSTRACT

A battery management system (BMS) described herein determines the internal resistance for a cell that may have an internal short circuit. In one aspect, the BMS monitors the voltage across each of a plurality cells that are coupled in series. If the voltage across one of the cells differs from the voltages across the other cells, the BMS can flag the cell as potentially having an internal short circuit. Once flagged, the BMS can use a simulator that stores a model cell that has similar characteristics as the cells monitored by the BMS to determine the internal resistance of the flagged cell. In one aspect, the simulator changes the value of a surrogate resistor that is parallel with the model cell until the voltage across the model cell matches the voltage of the flagged cell. The value of the surrogate resistor indicates the internal resistance of the flagged cell.

20 Claims, 7 Drawing Sheets

DETECTING INTERNAL SHORT CIRCUITS IN BATTERIES

CROSS-REFERENCE TO RELATED APPLICATIONS

The present disclosure is a continuation of U.S. patent application Ser. No. 15/246,194 filed on 2016 Aug. 25 and now issued as U.S. Pat. No. 10,330,739, is incorporated herein by reference in its entirety.

FIELD

The present disclosure relates to monitoring a battery, and more specifically, to identifying short circuits in battery cells.

BACKGROUND

Short circuits in internal cells can cause batteries, in particular Li-Ion batteries, to experience thermal runaway which can cause the batteries to no longer function. Typically, anode and cathode portions of a cell are separated by an insulative barrier. However, this barrier can deteriorate such that current can flow between the cathode and anode portions through the barrier. This internal short circuit reduces the internal resistance of the battery and can lead to thermal runaway. For example, when a short circuit reduces the internal resistance, the likelihood of overcharging or over-discharging the cell increases. Overcharging or over-discharging the cell increases the cell temperature and can eventually lead to thermal runaway.

Moreover, as the temperature of the battery rises, the barrier can deteriorate further which increases the internal short circuit and decreases the internal resistance of the battery. This problem can be exasperated by manufacturing defects in the cell where metal debris from the fabrication process can reduce the effectiveness of the internal barrier thereby leading to a short circuit. Detecting and managing internal short circuits can extend the life of the cell (i.e., prevent or slowdown the rate at which the short circuit increases) and prevent thermal runaway.

SUMMARY

One aspect described herein is system that includes a plurality of cells coupled in series to power a load and a battery management system configured to identify a flagged cell of the plurality of cells that has an electrical parameter different from another cell of the plurality of cells. The battery management system is configured to simulate a cell model representing one of the plurality of cells and change a value of a simulated surrogate resistor until a first voltage across the cell model equals a second voltage across the flagged cell where the value of the simulated surrogate resistor is assigned as a value of an internal resistance of the flagged cell.

Another aspect described herein is a computing system that includes at least one computer processor and a memory storing a program, wherein, when executed by the computer processor, the program is configured to perform an operation that includes identifying a flagged cell of a plurality of cells that has an electrical parameter different from another cell of the plurality of cells where the plurality of cells are coupled in series to power a load. The operation also includes simulating a cell model representing one of the plurality of cells and changing a value of a simulated surrogate resistor until a first voltage across the cell model equals a second voltage across the flagged cell, wherein the value of the simulated surrogate resistor is assigned as a value of an internal resistance of the flagged cell.

Another aspect described herein is a method for monitoring a plurality of cells of a battery coupled in series to power a load. The method includes identifying a flagged cell of the plurality of cells that has an electrical parameter different from another cell of the plurality of cells, simulating, using one or more processors, a cell model representing one of the plurality of cells, and changing a value of a simulated surrogate resistor until a first voltage across the cell model equals a second voltage across the flagged cell, wherein the value of the simulated surrogate resistor is assigned as a value of an internal resistance of the flagged cell.

Another aspect described herein is a system that includes a plurality of cells coupled in series to power a load, a spare cell selectively coupled to the plurality of cells, and a battery management system configured to identify a flagged cell of the plurality of cells that has a charge imbalance relative to another cell of the plurality of cells. The battery management system is also configured to enable the spare cell to compensate for the charge imbalance on the flagged cell during at least one of a charge cycle or discharge cycle, determine total energy stored in, or drained from, the spare cell during the at least one charge cycle of discharge cycle, and determine an internal resistance of the flagged cell using the total energy.

BRIEF DESCRIPTION OF THE DRAWINGS

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

A battery management system (BMS) described herein can determine the internal resistance for a cell that may have an internal short circuit. In one aspect, the BMS monitors the voltage across each of a plurality of cells that are coupled in series. If the voltage (e.g., an electrical parameter) across one of the cells differs from the voltages across the other cells, the BMS can flag the cell as potentially having an internal short circuit. Once flagged, the BMS can use a simulator that stores a cell model that has similar characteristics as the cells monitored by the BMS to determine the internal resistance of the flagged cell. In one aspect, the simulator changes the value of a surrogate resistor that is parallel with the cell model until the voltage across the cell model matches the voltage across the flagged cell. The value of the surrogate resistor indicates the internal resistance of the flagged cell.

In other aspects, the BMS couples a spare cell to the flagged cell to compensate for charge imbalance when charging or discharging the plurality of cells. That is, because the flagged cell has a lower internal resistance, the flagged cell charges and discharges faster (i.e., holds less charge) than the other cells. The spare cell compensates for the lack of capacity in the flagged cell by either storing additional charge (during a charging cycle) or sourcing charge (during a discharge cycle). By monitoring the amount of charge stored or discharged in the spare cell, the BMS can determine the efficiency of the flagged cell and determine whether or not the flagged cell has an internal short circuit. Furthermore, the BMS can determine if the internal short is a resistive short or a kinetic short and estimate a time when the cell should be drained and removed from the circuit.

In another aspect, the BMS can use the spare cell to identify a cell that may have an internal short circuit. In response to detecting a charge imbalance between cells during a charge or discharge cycle, the BMS can identify a cell that has a different charge than the other cells and use a spare cell to compensate for the charge imbalance. By monitoring the charge sourced by, or stored in, the spare cell, the BMS can determine the internal resistance of the flagged cell. As above, the BMS can then monitor the identified or flagged cell to determine whether the charge imbalance is due to an internal short circuit.

Figure 1:
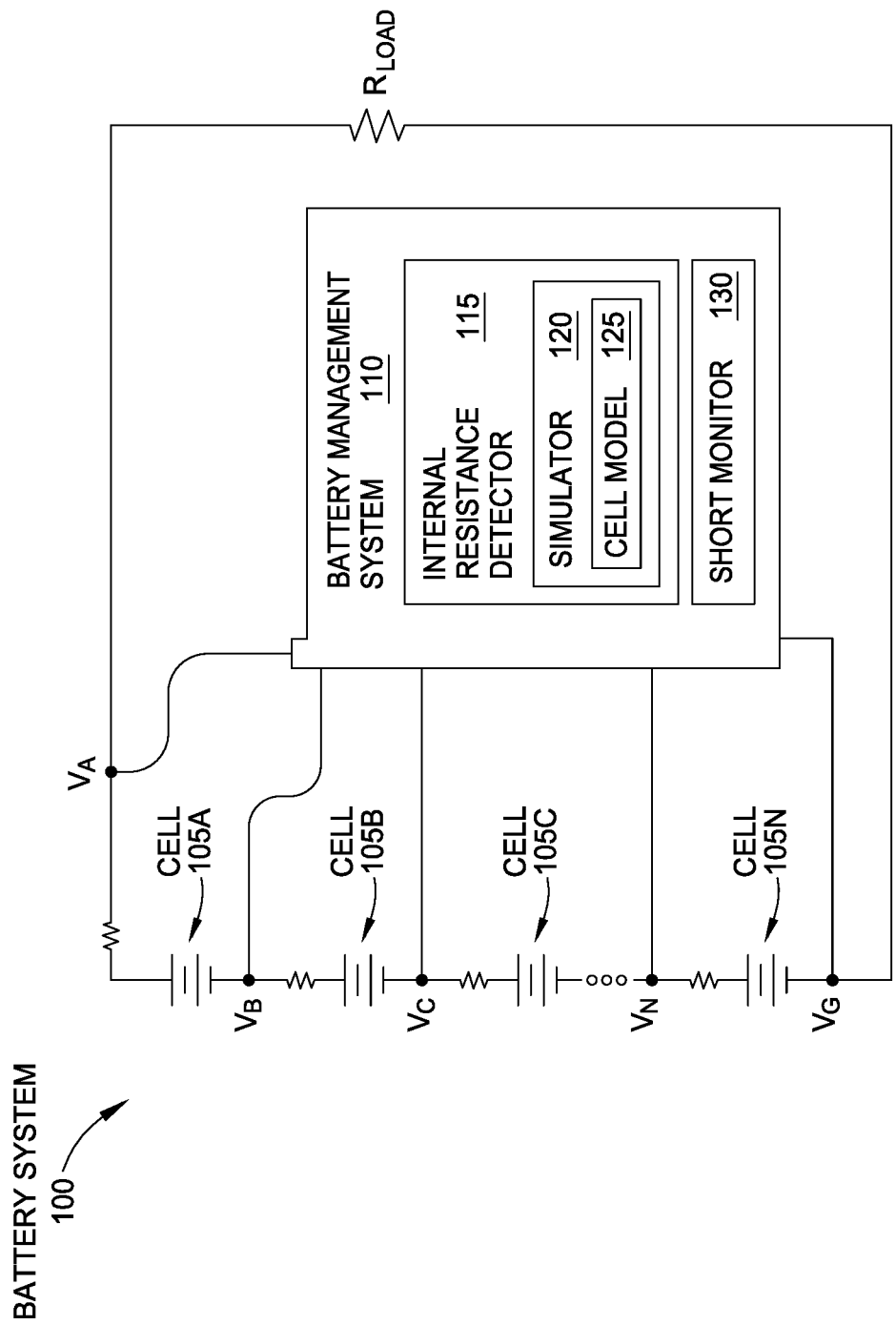
FIG. 1 illustrates a battery system that detects short circuits in battery cells.

FIG. 1 illustrates a battery system 100 that detects short circuits in battery cells 105. The battery system 100 includes multiple battery cells 105 coupled in series to provide a voltage across a load $R_{LOAD}$. A BMS 110 includes an internal resistance detector (IRD) 115 and a short monitor 130. As shown, the BMS 110 monitors the voltage across each of the cells 105 using the nodes $V_A$, $V_B$, $V_C$, $V_N$, and $V_G$. In one aspect, the IRD 115 measures the voltage across each of the cells 105 and determines if the voltages are approximately the same (e.g., within a predefined threshold). As described later, if the voltage across one of the cells 105 differs from the voltages across the other cells, the non-conforming cell 105 can be flagged to determine if the voltage difference is the result of an internal short. The BMS 110 may include hardware, firmware, software, or some combination thereof for performing the functions herein. In one aspect, the BMS 110 is a software application stored in memory that is executed using one or more computing processors in a computing system.

The IRD 115 includes a simulator 120 which in turn includes a cell model 125. The simulator 120 can be any circuit or physics based modelling application or program which can use the cell model 125 to simulate the behavior of the real-world cells 105. The simulator 120 can use the voltages measured across the cells 105 to simulate similar behavior using the cell model 125. As described in greater detail below, the simulator 120 can identify an internal resistance of a flagged cell. Generally, an internal short in a cell 105 causes the internal resistance of the cell 105 to decrease. Using the simulator 120, the IRD 115 can identify the value of the internal resistance of a flagged cell.

The short monitor 130 monitors the internal resistance of the flagged cell to avoid thermal runaway. Although a cell 105 may have an internal short, this does not necessary mean the cell 105 has to be discharged and disconnected from the load. Instead the short monitor 130 can perform steps to ensure the flagged cell is not overcharged or over-discharged so that that short circuit does not increase (or at least slow down the rate at which the short circuit increases). Doing so increases the life of the battery and its value. If the short circuit continues to increase, eventually the short monitor 130 can discharge the flagged cell 105 and disconnect it from the load and the other cells 105.

Figure 2:
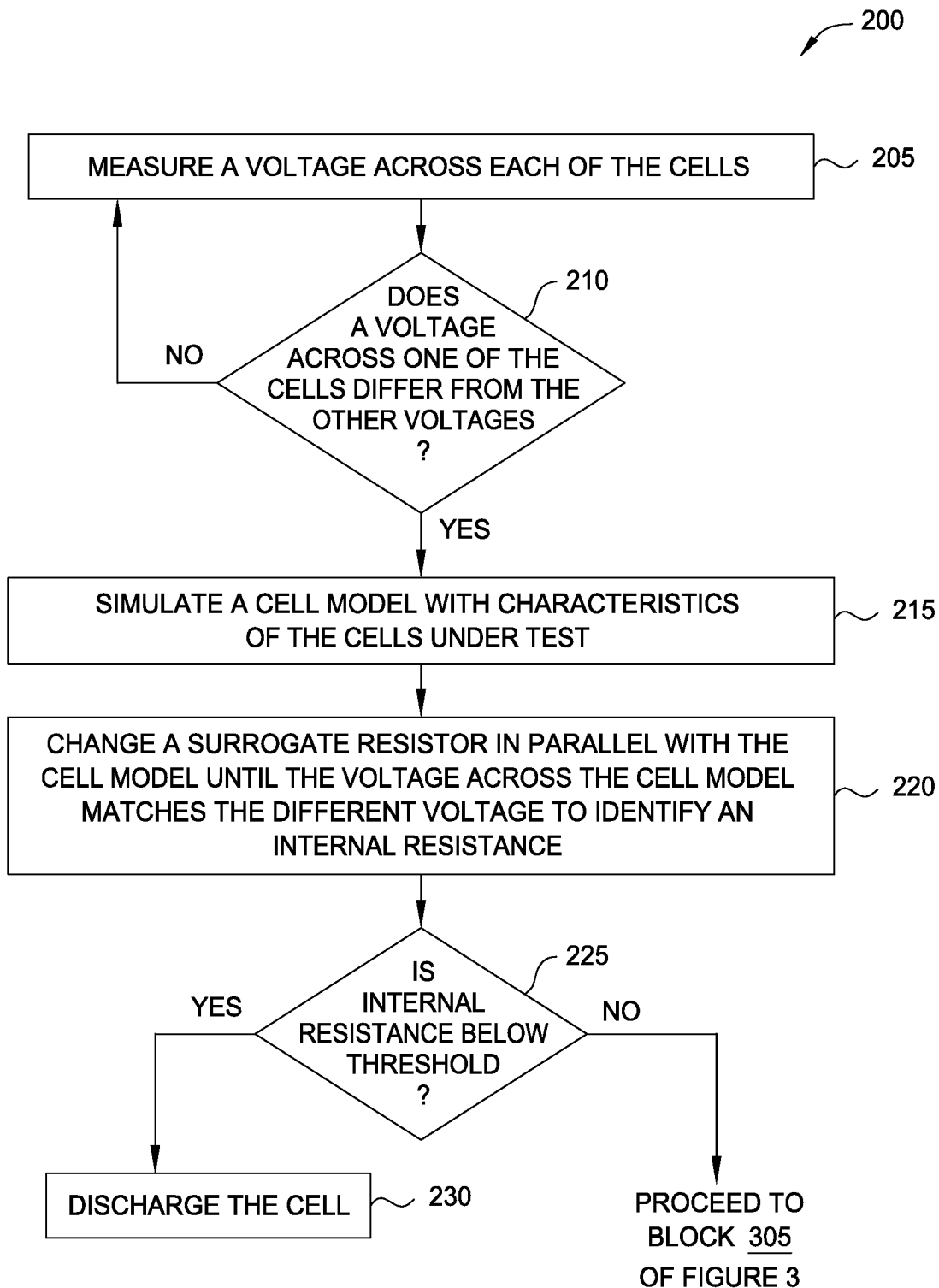
FIG. 2 is a flowchart for measuring internal resistance using a simulation.

FIG. 2 is a flowchart of a method 200 for measuring internal resistance using a simulator. For clarity, the blocks in method 200 are described using the various components in the battery system 100 illustrated in FIG. 1. At block 205, the BMS 100 measures a voltage across each of the cells 105, and at block 210, the IRD 115 determines if a voltage across one of the cells 105 differs from the other voltages. In one aspect, the IRD 115 may use a statistical model or an error threshold to determine if the voltage across each of the cells 105 differs substantially from the voltages across the other cells 105. For example, the IRD 115 may calculate the average voltage for the cells 105 and determine if any one of the cells 105 has a voltage that differs by more than 10% of the average. If a cell has a substantially different voltage, method 200 flags the cell and proceeds to block 210. If not, method 200 returns to block 205 where the voltages across the cells 105 are again monitored.

At block 215, the simulator 120 simulates a cell model 125 with characteristics of the cells 105 under test by the BMS 110. Put differently, the cell model 125 is a virtual replica of the physical cells 105 used in the battery. If the battery includes different types of cells, the simulator 120 may include corresponding cell models for each cell type. In one aspect, the cell model 125 is a model of the physical material used in the cells 105 such as the material forming the anode, cathode, etc. In another aspect, the cell model 125 is a circuit based model where circuit elements are used to model the functionality of the physical cells 105.

At block 220, the simulator 120 changes a simulated surrogate resistor in parallel with the cell model 125 until the voltage across the cell model 125 matches the voltage across the flagged cell to identify an internal resistance. Changing the value of the simulated surrogate resistor changes the voltage across the cell model 125. Once the voltage across the cell model 125 matches the voltage of the flagged cell, the value of the surrogate resistor is assigned the value of the internal resistance of the flagged cell.

At block 225, the IRD 115 determines if the internal resistance of the flagged cell is below a threshold. For example, the threshold may be a predefined value relative to a normal internal resistance of the cells 105 which may be provided by the manufacture of the battery—e.g., 70% of the normal internal resistance value. In one aspect, the threshold indicates when the flagged cell has an internal resistance (and a corresponding internal short circuit) that could result in thermal runaway in the near future—e.g., within several charge or discharge cycles. Thus, if the internal resistance is below the threshold, the IRD 115 discharges the cell 105—i.e., drains the charge from the cell 105—and disconnects the cell 105 from the load. In one aspect, the battery system 100 includes a separate discharge circuit to which the flagged cell 105 is electrically coupled to safely discharge the cell 105 and avoid thermal runaway. However, if the internal resistance of the flagged cell is above the threshold, method 200 proceeds to block 305 of FIG. 3.

Figure 3:
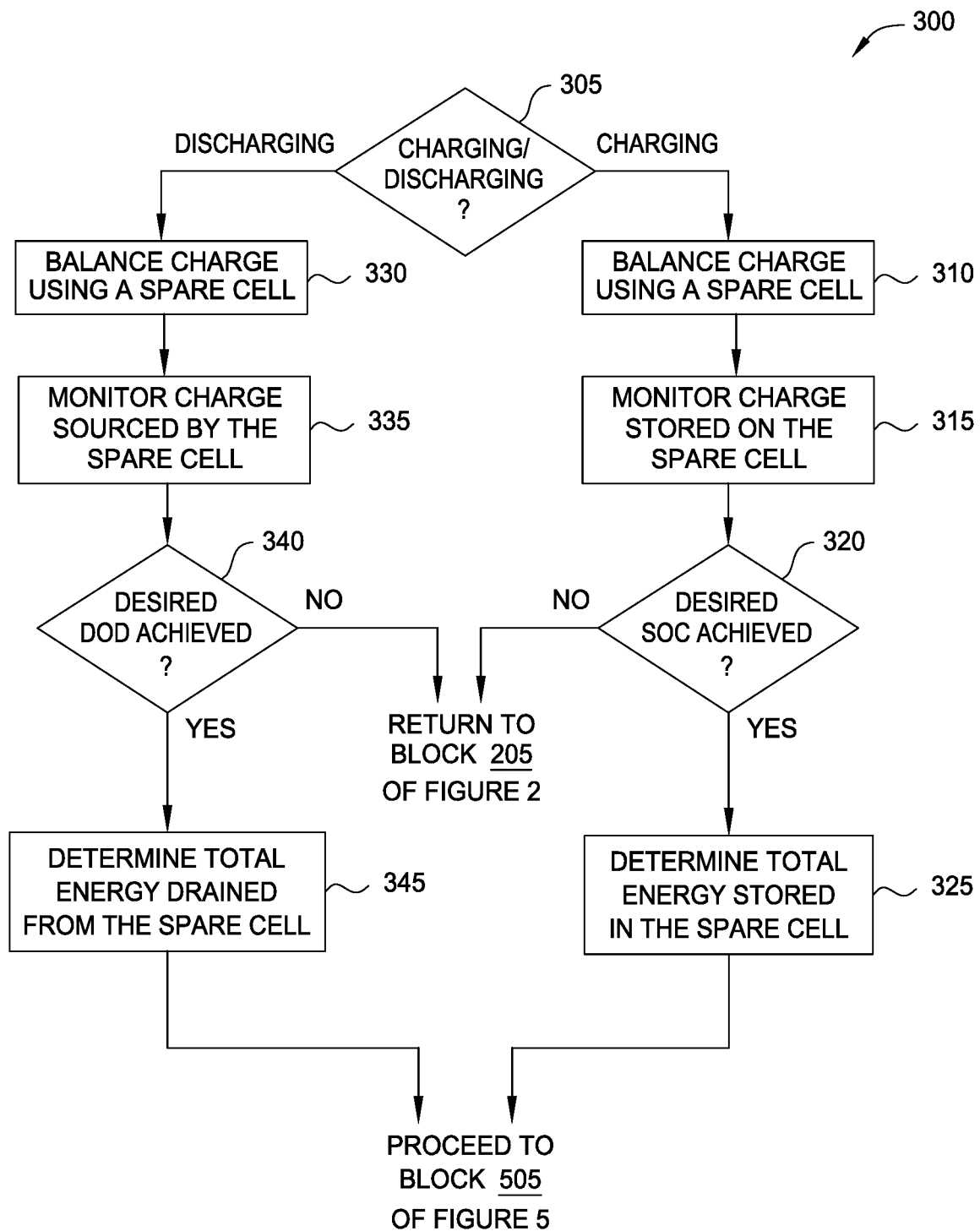
FIG. 3 is a flowchart for balancing charge using a spare cell.

FIG. 3 is a flowchart of a method 300 for balancing charge using a spare cell. For clarity, method 300 is discussed along with the circuit diagrams in FIGS. 4A and 4B which illustrate circuits for balancing charge using a spare cell. At block 305, the short monitor determines if the cell flagged using method 200 is performing a charge cycle or a discharge cycle. If the flagged cell is being charged, method 300 proceeds to block 310 where the short monitor balances charge using a space cell. Because the internal resistance of the flagged cell (assumed to be cell 105A in FIGS. 4A and 4B) is smaller than the internal resistance of the other cells 105B-N, the flagged cell charges quicker than the other cells 105B-N. For example, if the BMS wants the state of charge (SOC) of the cells 105 to be 90% of the total capacity of the cells 105, applying a voltage using a bulk charger 410 across the ends of the cells 105 results in the flagged cell 105A reaching the desired SOC quicker than the other cells 105B-N. Thus, by the time the other cells 105B-N reach the desired SOC, the flagged cell 105A is in an overcharged state. Because continuing to apply the voltage generated by the bulk charger 410 would cause the flagged cell 105A to be overcharged, the battery circuit 400 includes a spare cell 405 that is switchably coupled to the flagged cell 105A to sink charge so that the cell 105A is not overcharged. Put differently, by coupling the spare cell 405 in parallel with one of the cells 105, the battery circuit 400 can charge the cells 105 at substantially the same rate.

In another aspect, an internal short can drain one of the cells 105 while the cells 105 are being charged. For example, if the internal short in the flagged cell 105A drains the power from the cell 105A as the cells 105 are being charge, the rate of charge of the flagged cell 105A may be slower than the rate of charge of the other cells 105. In this case, coupling the spare cell 405 in parallel with the flagged cell 105A supplies additional charge to the flagged cell 105A (i.e., increases the rate the flagged cell 105A is charged) until the desired SOC is reached.

Although the circuit 400 illustrates coupling the spare cell 405 to the cell 105A via a transformer 415 and flyback converter 420, in one aspect the circuit 400 can switch the spare cell 405 to any of the cells—e.g., cells B-N—such that the spare cell 405 can sink charge for any one of the cells 105. Put differently, the circuit 400 can use a single spare cell 405 for balancing the charge on any one of the cells 105. In other aspects, the battery circuit 400 may include a pre-defined ratio of cells 105 and spare cells 405—e.g., one spare cell for every ten normal cells in the battery.

The bulk charger 410 generates a charge current $I_{CH}$ which adds charge (and increases the SOC) of the cells 105. The internal short circuit in cell 105A is represented by the resistance $R_{SC}$ which is in parallel with the cell 105A, and thus, reduces the internal resistance of the cell 105A. Stated differently, the resistance $R_{SC}$ reduces the capacity of the cell 105A to store charge relative to the other cells 105. By coupling the spare cell 405 as shown to the flagged cell 105A, the spare cell 405 can sink additional charge that would otherwise be forced into cell 105A thereby preventing the cell 105A from being overcharged.

At block 315, the BMS 110 monitors the charge stored on the spare cell 405 while charging the cells 105. That is, the short monitor determines how much charge is stored in the spare cell 405 during the charging cycle by monitoring, e.g., the current or voltage across the spare cell 405 during the cycle.

At block 320, the short monitor 130 determines if the cells 105 have reached the desired SOC (e.g., 90% of the total capacity of a normally functioning cell). The aspects herein are not limited to any particular technique for measuring the SOC of the cells 105. Because the spare cell 405 can sink the extra charge of the flagged cell 105A, the SOC for all the cells 105 increases at substantially the same rate (assuming the internal resistance for the other cells 105B-N is essentially the same).

If the desired SOC is not attained, method 300 returns to block 205 of FIG. 2. There, the BMS 110 again measures the voltage across the cells to determine the internal resistance of the flagged cell and ensure that the internal resistance does not fall below the threshold. If so, the BMS 110 stops the charging cycle and discharges the flagged cell. In one aspect, while charging the cells 105, the BMS 110 may perform method 200 before the desired SOC is reached at block 320. Doing so ensures that the internal resistance of the flagged cell (or any of the other cells) does not fall below the threshold which can lead to thermal runaway.

Once the SOC is reached (and the internal resistance is above the threshold), method 300 proceeds to block 325 where the short monitor 130 determines total energy stored in the spare cell 405 during the charge cycle. For example, the short monitor 130 may sum up or combine the charge stored on the spare cell 405 during the charge cycle which was determined at block 315. The method 300 proceeds to block 505 of FIG. 5 where the total energy stored in the spare cell 405 can be used to diagnosis whether the internal resistance of the flagged cell is due to an internal short circuit or other factor (e.g., normal aging process).

Figure 4A:
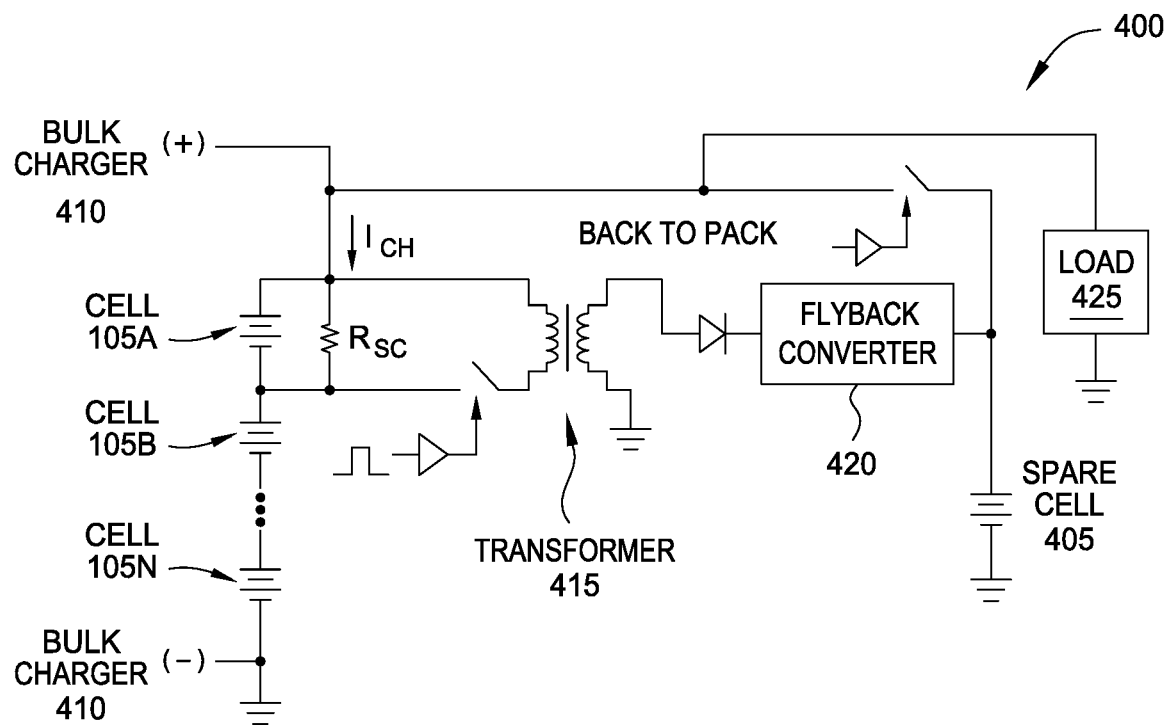
FIGS. 4A and 4B illustrates circuits for balancing charge using a spare cell.
Figure 4B:
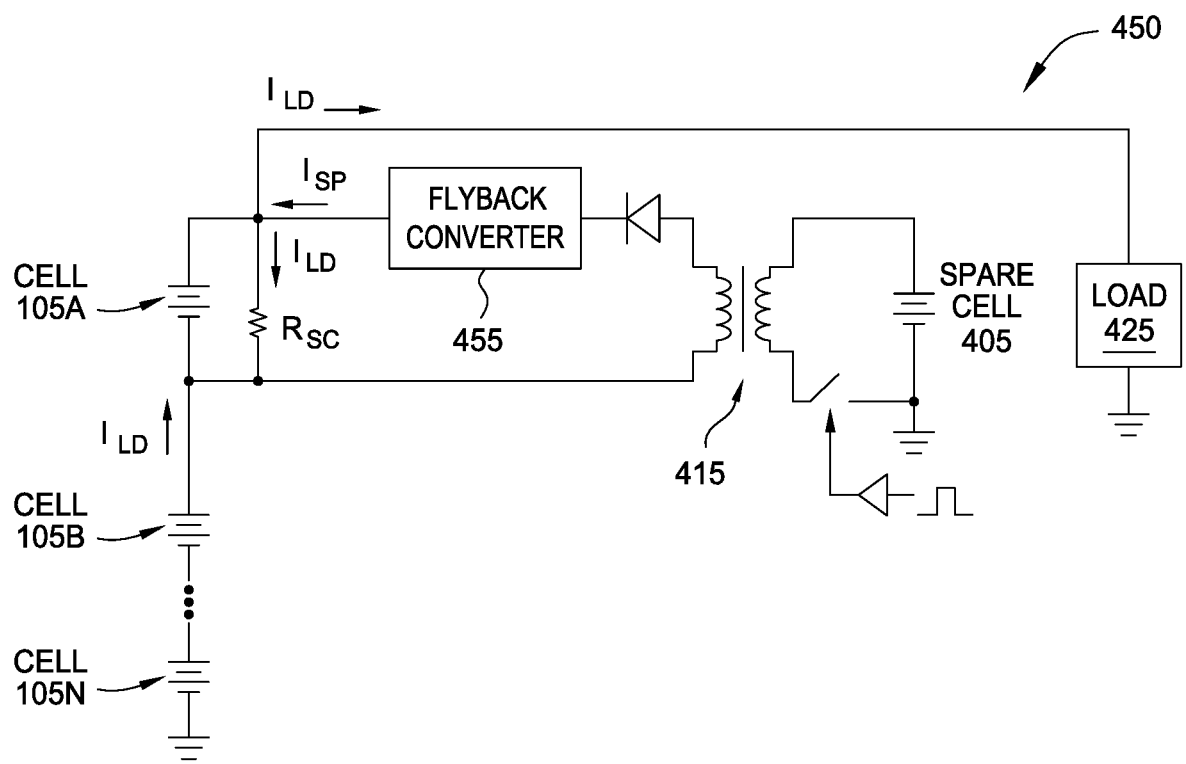

If the BMS 110 determines at block 305 that the cells are being discharged during a discharge cycle, method 300 proceeds to block 330 where the short monitor 130 balances the charge provided by the cells 105 using the spare cell 405. FIG. 4B illustrates a circuit 450 with a spare cell 405 for providing additional charge. As shown, the cells 105 generate a load current $I_{LD}$ that provides power to a load 425. However, because of the decrease capacity of the cell 105A due to the short circuit resistance $R_{SC}$, the discharge rate of the cell 105A is less than the other cells 105B-N. For example, the discharge rate of cell 105A may be 3 Amp/hr while the rate for cells 105B-N is 4 Amp/hr. Thus, coupling the cells 105 to the load 425 for equal amounts of time may place the cell 105A in an over-discharged state. Put differently, the resistance $R_{SC}$ adds an additional load to the cell 105A which means less charge can be dedicated to powering the load 425. As a result, the charge stored in the cell 105A may be depleted before the cells 105B-N. As mentioned above, over-discharging a lithium-ion cell can increase the internal short circuit and the internal temperature of the cell thereby increasing the likelihood of thermal runaway.

The circuit 450 in FIG. 4B illustrates coupling the spare cell 405 to the flagged cell 105A using the transformer 415 and a flyback converter 455. In one aspect, the circuit 450 in FIG. 4B and the circuit 400 in FIG. 4A are different arrangements of the same battery system. That is, the same battery system may be arranged using switches to form the two different circuits 400 and 450 that include the cells 105 and spare cell 405 depending on whether the battery system is performing a discharge cycle or a charge cycle. In the circuit 450, the spare cell 405 provides additional charge illustrated by current $I_{SP}$ to supplement the charge provided by cell 105A to prevent the cell 105A from being over-discharged.

At block 335, the BMS 110 monitors the charge sourced by the spare cell 405 during the discharge cycle. That is, the short monitor 130 determines how much charge is provided by the spare cell 405 during the discharge cycle by monitoring, e.g., the current or voltage across the spare cell 405 during the cycle.

At block 340, the short monitor 130 determines if the cells 105 have reached the desired depth of discharge (DOD) (e.g., 10% of the total capacity of a normally functioning cell). The aspects herein are not limited to any particular technique for measuring the DOD of the cells 105. Because the spare cell 405 can source extra charge, the DOD for all the cells 105 decreases at substantially the same rate (assuming the internal resistance for the other cells 105B-N is essentially the same).

If the desired DOD is not attained, method 300 returns to block 205 of FIG. 2. There, the BMS 110 again measures the voltage across the cells to measure the internal resistance of the flagged cell and ensures that the internal resistance does not fall below the threshold. If so, the BMS stops the discharging cycle and discharges the flagged cell using, for example, a load separate from the load 425. In one aspect, while discharging the cells 105, the BMS 110 may perform method 200 multiple times before the desired DOD is reached at block 340.

Once the desired DOD is reached (and the internal resistance does not fall below the threshold), method 300 proceeds to block 345 where the short monitor 130 determines the total energy drained from the spare cell 405 during the discharge cycle. The total energy sourced by the spare cell 405 can be used to diagnosis whether the discrepancy in the internal resistance of the flagged cell relative to the other cells is caused by an internal short circuit or part of the normal aging process. To do so, method 300 proceeds to block 505 of FIG. 5.

Figure 5:
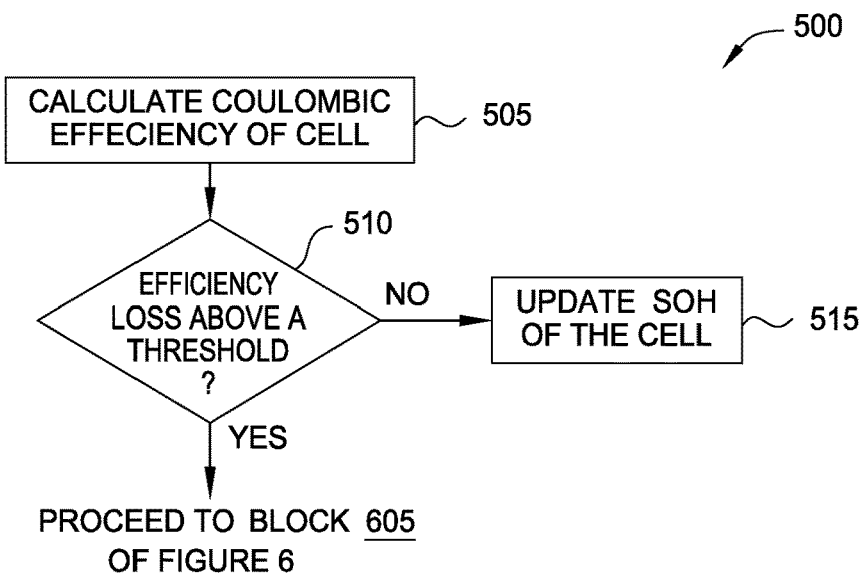
FIG. 5 is a flowchart for classifying a drop in efficiency as capacity loss of a cell or an internal short circuit.

FIG. 5 is a flowchart of a method 500 for classifying a drop in efficiency as a capacity loss of a cell or a short circuit. At block 505, the short monitor calculates the coulombic efficiency of the flagged cell. In one aspect, the coulombic efficiency indicates the degradation of the flagged cell over one discharge or charge cycle. For example, the short monitor 130 may calculate a percentage indicating the drop in coulombic efficiency of the flagged cell after a charge or discharge cycle. In one aspect, the short monitor 130 calculates the coulombic efficiency by determining the ratio between how much charge is stored in the flagged cell during a charge cycle relative to how much charge is sourced by the flagged cell during a discharge cycle. The short monitor 130 may use the total energy stored or drained from the spare cell during the charge or discharge cycle in order to determine the efficiency of the flagged cell.

At block 510, the short monitor 130 determines if the efficiency loss is above a threshold. For example, if the coulombic efficiency of the flagged cell drops by less than 5% during a pair of discharge and charge cycles, method 500 proceeds to block 515 where the BMS updates the state of health (SOH) of the flagged cell to indicate that the capacity of the cell has decreased. Put differently, if the efficiency loss is less than the threshold, the short monitor determines the lower internal resistance of the flagged cell relative to the other cells is not caused by an internal short circuit, but rather some other factor. For example, as batteries age, the materials in the cells can degrade leading to drops in the internal resistance even in the absence of an internal short. In one aspect, the BMS may accept at most a 20% capacity loss overtime (regardless is the cell has an internal short) before the BMS discharges the flagged cell and disconnects the cell from the load. Using methods 200, 300, and 500, the BMS can identify drops in internal resistance and determine if these drops are caused by internal short circuit or another factor or factors. If, however, the loss of efficiency is above the threshold, the short monitor 130 determines the drop in internal resistance is due to an internal short and proceeds to block 605 of FIG. 6.

Figure 6:
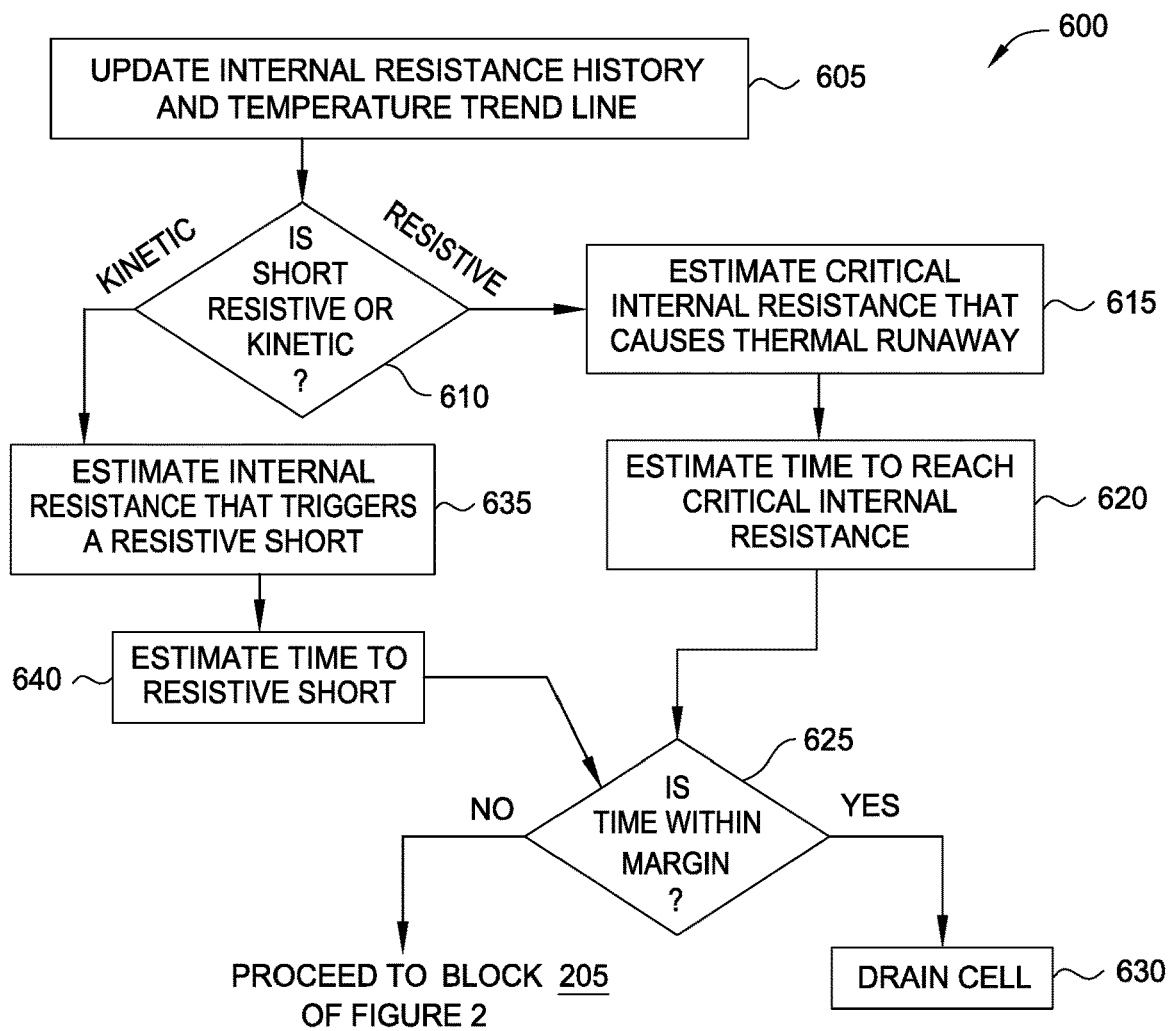
FIG. 6 is a flowchart for managing a cell with an internal short circuit.

FIG. 6 is a flowchart of a method 600 for managing a cell with a short circuit. In one aspect, method 600 is performed after the short monitor determines that the flagged cell has an internal short circuit using, e.g., method 500. At block 605, the BMS updates internal resistance history and a temperature trend line for the flagged cell. In one example, the short monitor stores the current internal resistance of the flagged cell in a history so that changes in the internal resistance over time or over different charge/discharge cycles is tracked. Moreover, the BMS can determine the temperature of the cell using one or more temperature sensors which can be used to anticipate and prevent thermal runaway. The temperature trend line indicates how the temperature of the cell has changed over time.

At block 610, the short monitor determines if the internal short is a resistive short or a kinetic short. A kinetic short is due to electrochemical reactions in the cell and depends on the rate of charge or discharge and the current SOC of the cell. A resistive short, in contrast, is not dependent these factors. By determining if the rate of charge/discharge and the SOC alters the internal resistance, the short monitor can determine if the internal short is resistive or kinetic.

If resistive, method 600 proceeds to block 615 where the short monitor estimates a critical internal resistance that causes thermal runaway. Here, the short monitor may use the historical data tracking the internal resistance and its effect on temperature to estimate the critical internal resistance of the flagged cell that will cause thermal runaway. At block 620, the short monitor estimates the time to reach the critical internal resistance, and thus, when thermal runaway is likely to occur. At block 625, the short monitor determines if the estimated time is within a margin—e.g., less than two discharge/charge cycles. Put differently, the short monitor determines if the internal resistance will reach the critical internal resistance within two discharge/charge cycles. If so, method 600 proceeds to block 630 where the flagged cell is drained or discharged and is electrically disconnected from the load and the other cells in the battery. In one example, the BMS sets the margin to allow time for the cell to be discharged (which may be performed slowly so the temperature does not cause thermal runaway) before the internal resistance reaches the critical value.

However, if at block 610 the short monitor determines the internal short is kinetic, method 600 proceeds to block 635 where the short monitor estimates an internal resistance that triggers a resistive short. That is, although the short is currently a kinetic short, the short monitor determines what internal resistance would cause the internal short to change into a resistive short that is not dependent on rate of charge/discharge and/or the current SOC. Put differently, resistive shorts are due to hard shorts, not due to kinetic reactions. In a lithium ion battery, the transfer of ions is dependent on ionic concentration gradients and diffusion rates between the electrolyte material and the electrodes. The transfer of charge due to these properties determines the kinetic side of the cell impedance. The cell impedance won't be constant, but would depend on the SOC, Ageing, Rate of C/X, and temperature.

At block 640, the short monitor estimates the time to until the kinetic short is changed in a resistive short. In one aspect, determining when the kinetic short changes into a resistive short can be used to estimate when the cell will experience thermal runaway. If, at block 625, the short monitor determines the time determined at block 640 is within the margin, the BMS drains the cell at block 630. Otherwise, method 600 proceeds to block 205 of FIG. 2 where another charge and/or discharge cycle can be performed. In this manner, the BMS can continue to use a cell with a short circuit to power the load until the internal resistance falls to a point where doing so may soon result in thermal runaway.

Figure 7:
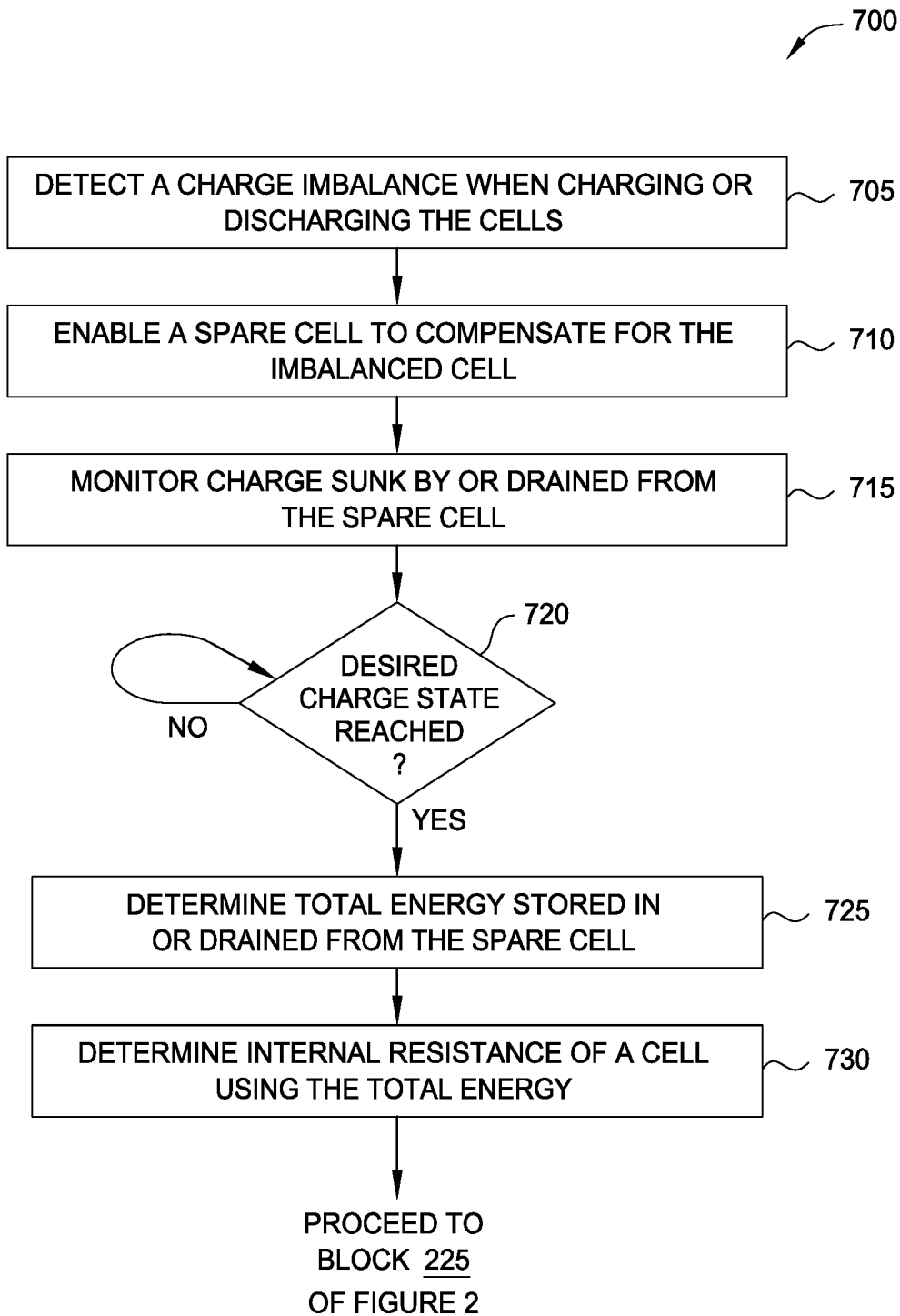
FIG. 7 is a flowchart for measuring internal resistance using a spare cell.

FIG. 7 is a flowchart of a method 700 for measuring internal resistance using a spare cell. For clarity, method 700 is discussed in tandem with FIG. 8 which illustrates a circuit 800 for measuring internal resistance using a spare cell 840. Instead of using a simulator and a model of a cell to determine the internal resistance of a cell 105 like in method 200, the method 700 and circuit 800 use a physical spare cell 840 which can be selectively coupled to one of the cells 105 to determine the internal resistance of that cell 105.

Figure 8:
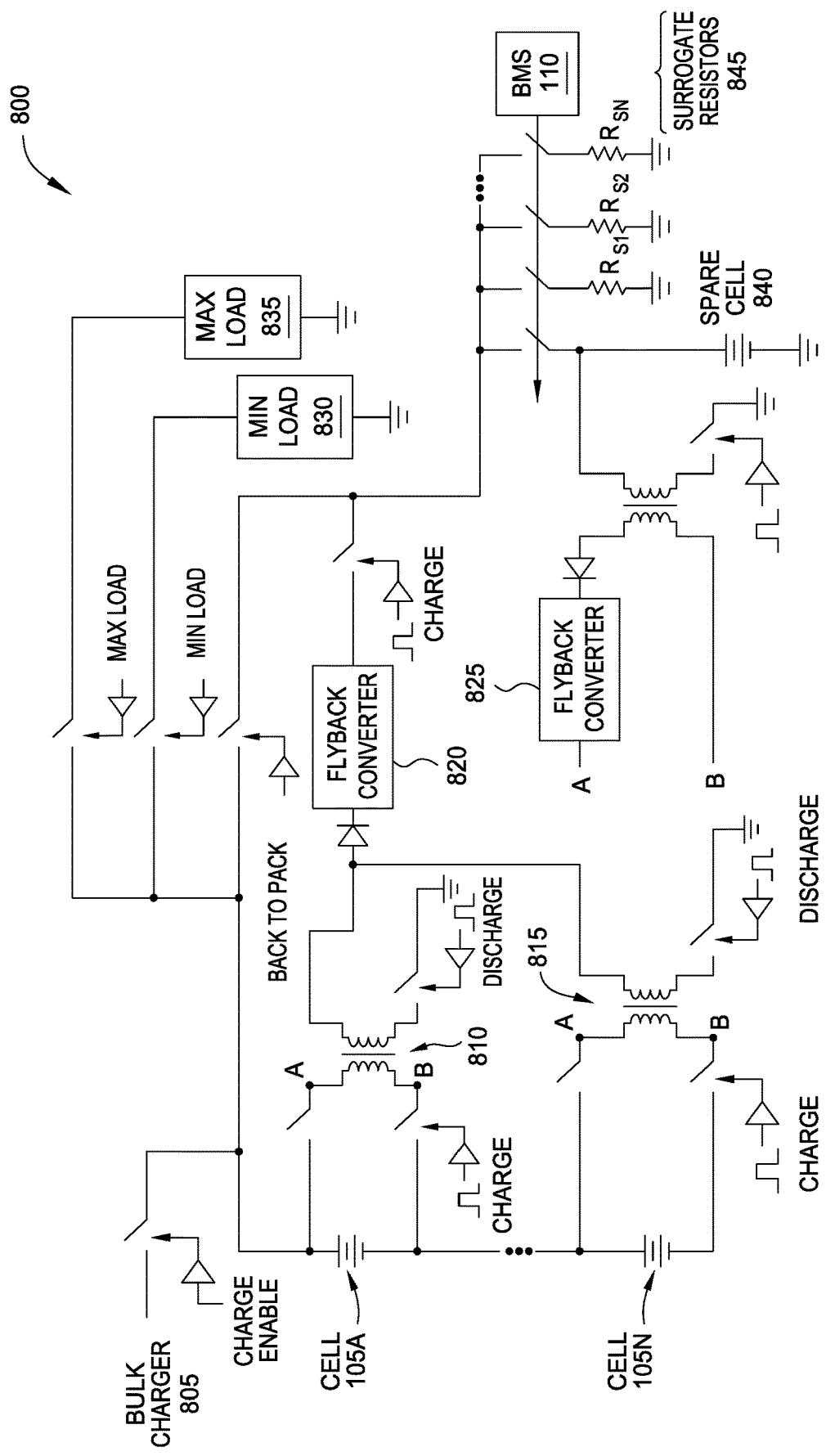
FIG. 8 illustrates a circuit for measuring internal resistance using a spare cell.

At block 705, the BMS 110 detects a charge imbalance when charging or discharging the cells 105. In one aspect, the BMS 110 may constantly or at intervals measure the SOC of each of the cells 105 when performing a charge or discharge cycle. Based on this charge measurement, the BMS 110 determines if one of the cells 105 is charging faster or slower than the other cells 105. In FIG. 8, it is assumed cell 105A has a charge imbalance relative to the other cells 105 in the circuit 800.

At block 710, the BMS 110 enables the spare cell 840 to compensate for the imbalanced cell 105A. As shown in circuit 800, the spare cell 840 is coupled to cell 105 via a transformer 810 and the flyback converter 820. If discharging the cells 105 using the min load 830 and max load 835, the spare cell 840 provides additional charge for compensating for the smaller charge in cell 105A so that cell 105A does not over-discharge. If charging the cells 105, the spare cell 840 sinks additional charge during the charging cycle so that the cell 105A is not overcharged.

At block 715, the BMS 110 monitors the charge sunk by, or drained from, the spare cell 840 during the charge or discharge cycle. For example, the BMS 110 may measure the voltage or current at the spare cell 840 to determine the charge sunk by the cell 840, or provided by the cell 840, during the charge or discharge cycle.

At block 720, the BMS 110 determines whether the desired charge state has been reached. In one aspect, the BMS 110 determines whether the cells 105 have reached the desired SOC or DOD, and if so, stops the charge or discharge cycle. If the desired charge state is not reached, method 700 continues to monitor the cells 105. However, if the charge state is reached, method 700 proceeds to block 725 where the BMS 110 determines the total energy stored in or drained from the spare cell 840. In one aspect, the BMS 110 may use the same or similar techniques as described in blocks 325 and 345 in FIG. 3 for determining the total energy.

At block 730, the BMS 110 determines the internal resistance of the imbalanced cell 105A using the total energy derived at block 725. For example, the BMS 110 may divide the total energy sunk or sourced by the spare cell 840 by the total time of the discharge or charge cycle to determine the current flowing into or out of the cell 105A. The value of the internal resistance is then found by dividing the voltage across the cell 105A by the current. Thus, method 700 can be used in place of (or as a redundant or backup system to) method 200 where a simulation of a model cell is used to determine the internal resistance of a cell 105. Once the internal resistance is known, method 700 proceeds to block 225 of FIG. 2 where the internal resistance can be compared to a threshold, and if above the threshold, the BMS 110 can perform methods 300, 500, and 600 as described above to characterize, diagnosis, and handle an internal short.

In one aspect, instead of measuring a charge imbalance to identify a cell 105 with an internal short, circuit 800 may monitor the voltage across each cell 105 as describe in method 200. If the voltage across one cell 105 differs substantially from the voltages across the other cells 105, the BMS 110 couples the spare cell 840 in parallel to the flagged cell (cell 105A in this case). The BMS 110 can control switches coupling surrogate resistors 845 in parallel with the spare cell 840 until the voltage across the spare cell 840 is the same as the voltage across the flagged cell 105A. Thus, the circuit 800 can perform a very similar process as the one described in method 200 except using physical cells and resistors rather than simulated ones. Once the voltages are equal, the value of the surrogate resistors 845 (which can include several individual resistors in parallel) should equal the value of the internal resistance of the spare cell 840.

The aspects described herein can advantageously be used to prevent or mitigate thermal runaway in a battery. By monitoring the internal resistance of a cell in the battery, the BMS can detect internal shorts and ensure the internal resistance does not reduce to a point where thermal runaway can occur. Further, the battery system can include a spare cell which can be used to prevent a cell with an internal short from being overcharged or over-discharged which means the cell can continue to be used to provide power to a load—i.e., the cell does not need to be immediately disconnected from the other cells in series.

The descriptions of the various aspects have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein.

In the preceding paragraphs, reference is made to aspects presented in this disclosure. However, the scope of the present disclosure is not limited to specific described aspects. Instead, any combination of the preceding features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim(s).

Aspects may take the form of an entirely hardware aspect, an entirely software aspect (including firmware, resident software, micro-code, etc.) or an aspect combining software and hardware aspects that may all generally be referred to herein as a "circuit," "module" or "system."

Aspects may be a system, a method, and/or a computer program product. The computer program product may include a computer readable storage medium (or media) having computer readable program instructions thereon for causing a processor comprising hardware and software to carry out aspects described herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices comprising hardware and software from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present aspects may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some aspects, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects disclosed herein. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to aspects, other and further aspects may be devised without departing from the basic scope thereof, and the scope thereof is determined by the claims that follow.

What is claimed is:
1. A system, comprising:
a plurality of cells coupled in series to power a load;
a spare cell selectively couplable to the plurality of cells, initially uncoupled with the plurality of cells;
a battery management system configured to:
    identify a flagged cell of the plurality of cells that has a charge imbalance relative to another cell of the plurality of cells;
    selectively couple the spare cell to the plurality of cells to compensate for the charge imbalance on the flagged cell during a charge cycle or discharge cycle;
    determine total energy stored in, or drained from, the spare cell during the charge cycle or discharge cycle;
    determine an internal resistance of the flagged cell using the total energy; and in response to determining that the internal resistance of the flagged cell is below a predefined threshold, discharge the flagged cell.

2. The system of claim 1, wherein the battery management system is further configured to:
in response to determining that the internal resistance of the flagged cell is below the predefined threshold, disconnect the flagged cell from the load.

3. The system of claim 1, wherein the battery management system is further configured to:
in response to determining that the internal resistance of the flagged cell satisfies the predefined threshold, prevent the flagged cell from being overcharged or over-discharged during the charge cycle or the discharge cycle using the spare cell, wherein the spare cell at least one of: sinks charge during the charge cycle or provides charge during the discharge cycle.

4. The system of claim 1, wherein the battery management system is further configured to:
track an efficiency value for the flagged cell over time; and
determine whether the internal resistance of the flagged cell is due to an internal short in the flagged cell based on changes in the efficiency value.

5. The system of claim 4, wherein the battery management system is further configured to:
in response to determining that the internal resistance is due to the internal short in the flagged cell, determine whether the internal short is resistive or kinetic; and
estimate a time until the internal short is predicted to cause a failure of the flagged cell based on whether the internal short is resistive or kinetic.

6. The system of claim 5, wherein the battery management system is further configured to:
in response to determining that the estimated time satisfies a threshold, permit the flagged cell to be charged or discharged during a next charge cycle or discharge cycle; and
in response to determining that the estimated time does not satisfy the threshold, discharge the flagged cell and disconnect the flagged cell from the load before the next charge cycle or discharge cycle.

7. The system of claim 1, further comprising:
a plurality of surrogate resistors, selectively couplable via a corresponding plurality of switches to the spare cell and a load; and
wherein the battery management system is further configured to:
selectively control the plurality of switches to connect the spare cell in parallel to the flagged cell until a voltage across the spare cell matches a voltage across the flagged cell.

8. The system of claim 7, wherein the plurality of switches selectively couple the plurality of surrogate resistors in parallel to one another when connecting the spare cell to the flagged cell.

9. A computing system, comprising:
at least one computer processor; and
a memory storing a program, wherein, when executed by the computer processor, the program is configured to perform an operation comprising:
identify a flagged cell of a plurality of cells that has a charge imbalance relative to another cell of the plurality of cells, wherein the plurality of cells are coupled in series to power a load;
selectively coupling a spare cell, initially disconnected from the plurality of cells and the load, to the plurality of cells to compensate for the charge imbalance on the flagged cell during a charge cycle or discharge cycle;
determining total energy stored in, or drained from, the spare cell during the charge cycle or discharge cycle;
determining an internal resistance of the flagged cell using the total energy; and
in response to determining that the internal resistance of the flagged cell is below a predefined threshold, discharging the flagged cell and disconnecting the flagged cell from the load.

10. The computing system of claim 9, wherein the operation further comprises:
in response to determining that the internal resistance of the flagged cell satisfies the predefined threshold, preventing the flagged cell from being overcharged or over-discharged during the charge cycle or discharge cycle using the spare cell, wherein the spare cell at least one of: sinks charge or provides charge during the charge or discharge cycle.

11. The computing system of claim 9, wherein the operation further comprises:
tracking an efficiency value for the flagged cell over time; and
determining whether the internal resistance of the flagged cell is due to an internal short in the flagged cell based on changes in the efficiency value.

12. The computing system of claim 11, wherein the operation further comprises:
in response to determining that the internal resistance is due to the internal short in the flagged cell, determine whether the internal short is resistive or kinetic; and
estimate a time until the internal short is predicted to cause a failure of the flagged cell based on whether the internal short is resistive or kinetic.

13. The computing system of claim 12, wherein the operation further comprises:
in response to determining that the estimated time satisfies a threshold, permit the flagged cell to be charged or discharged during a next charge cycle or discharge cycle; and
in response to determining that the estimated time does not satisfy the threshold, discharge the flagged cell and disconnect the flagged cell from the load before the next charge cycle or discharge cycle.

14. The computing system of claim 9, wherein the operation further comprises:
selectively controlling a plurality of switches to connect the spare cell in parallel to the flagged cell with the load via a corresponding plurality of surrogate resistors until a voltage across the spare cell matches a voltage across the flagged cell.

15. A method, comprising:
identify a flagged cell of a plurality of cells that has a charge imbalance relative to another cell of the plurality of cells, wherein the plurality of cells are coupled in series to power a load;
selectively coupling a spare cell, initially disconnected from the plurality of cells and the load, to the plurality of cells to compensate for the charge imbalance on the flagged cell during a charge cycle or discharge cycle;
determining total energy stored in, or drained from, the spare cell during the charge cycle or discharge cycle;
determining an internal resistance of the flagged cell using the total energy; and in response to determining that the internal resistance of the flagged cell is below a predefined threshold, discharging the flagged cell and disconnecting the flagged cell from the load.

16. The method of claim 15, further comprising:
in response to determining that the internal resistance of the flagged cell satisfies the predefined threshold, preventing the flagged cell from being overcharged or over-discharged during the charge cycle or discharge cycle using the spare cell, wherein the spare cell at least one of: sinks charge or provides charge during the charge or discharge cycle.

17. The method of claim 15, further comprising:
tracking an efficiency value for the flagged cell over time; and
determining whether the internal resistance of the flagged cell is due to an internal short in the flagged cell based on changes in the efficiency value.

18. The method of claim 17, further comprising:
in response to determining that the internal resistance is due to the internal short in the flagged cell, determine whether the internal short is resistive or kinetic; and
estimate a time until the internal short is predicted to cause a failure of the flagged cell based on whether the internal short is resistive or kinetic.

19. The method of claim 18, further comprising:
in response to determining that the estimated time satisfies a threshold, permit the flagged cell to be charged or discharged during a next charge cycle or discharge cycle; and
in response to determining that the estimated time does not satisfy the threshold, discharge the flagged cell and disconnect the flagged cell from the load before the next charge cycle or discharge cycle.

20. The method of claim 15, further comprising:
selectively controlling a plurality of switches to connect the spare cell in parallel to the flagged cell with the load via a corresponding plurality of surrogate resistors until a voltage across the spare cell matches a voltage across the flagged cell.

* * * * *